United States Patent [19]

Stevens et al.

[11] Patent Number: 4,868,465

[45] Date of Patent: Sep. 19, 1989

[54] SWEEP GENERATOR ERROR CHARACTERIZATION

[75] Inventors: Douglas C. Stevens, Portland; Henry G. Fox, Sherwood, both of Oreg.

[73] Assignee: Tektronix, Inc., Beaverton, Oreg.

[21] Appl. No.: 902,363

[22] Filed: Aug. 29, 1986

[51] Int. Cl.$^4$ .............................................. G01R 13/28
[52] U.S. Cl. ..................................... 315/392; 315/367; 324/121 R
[58] Field of Search ................................ 315/367, 392; 324/121 R; 328/63, 146; 368/117; D10/76

[56] References Cited

U.S. PATENT DOCUMENTS 4,121,164 10/1978 Feucht .................................. 328/146
4,647,915 3/1987 Shank et al. ...................... 324/121 R Primary Examiner—Robert L. Griffin
Assistant Examiner—T. Salindong
Attorney, Agent, or Firm—John P. Dellett; Francis I. Gray

[57] ABSTRACT

A delay time between the start of a trace on an oscilloscope screen and a point along the trace is computed based on measured "sweep gain" and "sweep start" parameters characterizing a triggered sweep signal controlling the horizontal position of an electron beam creating the trace, the sweep signal increasing when triggered from a starting level at a constant slew rate to move the beam at a constant speed across the screen. The sweep start parameter is the value of input data applied to a digital-to-analog converter (DAC) which would cause the DAC to produce an output voltage equal to the sweep signal starting level, and the sweep gain indicates the rate of increase in DAC input data required to produce a DAC output signal with a rate of increase similar to the slew rate of the sweep signal. The horizontal position of the point along the trace is the beam position on the screen at the moment the sweep signal magnitude reaches the magnitude of the DAC output signal. The delay time is computed as the difference between the DAC input data resulting in this DAC output signal magnitude and the sweep start parameter, the difference being divided by the sweep gain parameter.

23 Claims, 3 Drawing Sheets

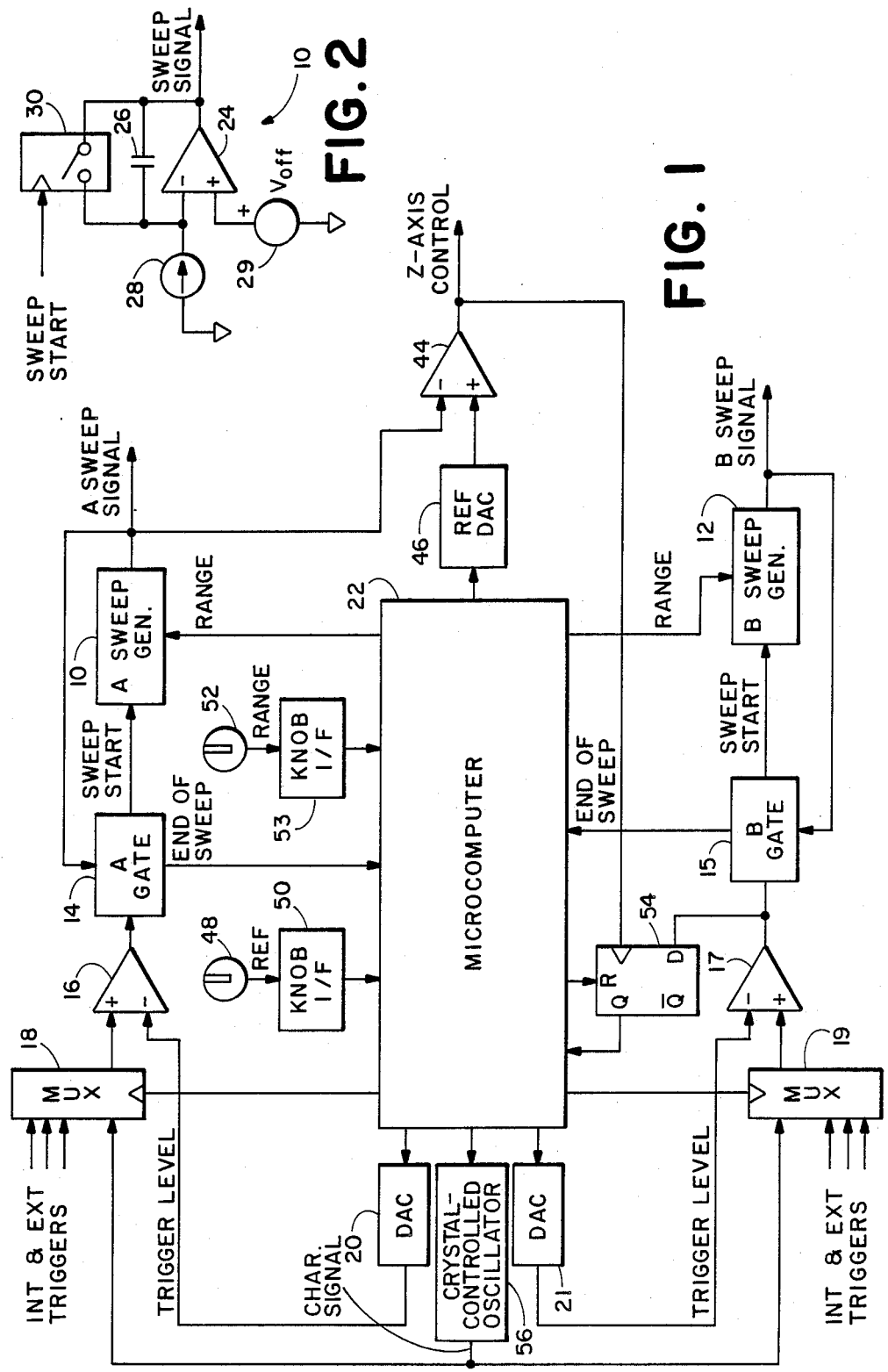

SWEEP GENERATOR ERROR CHARACTERIZATION

BACKGROUND OF THE INVENTION

The present invention relates in general to sweep generators and in particular to a method and apparatus for producing a set of parameters characterizing gain and offset errors in a sweep generator output.

Oscilloscopes typically employ at least one sweep generator to produce a voltage ramp output signal ("a sweep signal") for controlling the horizontal movement ("the sweep") of an electron beam across the screen of a cathode ray tube. When the vertical movement of the beam is controlled by an oscilloscope input signal generated by a device under test, the resulting waveform display on the screen represents the magnitude of the input signal as a function of time. The oscilloscope sweep generator initially maintains the sweep signal at a constant, predetermined starting level until the sweep is initiated by a trigger signal. Thereafter, the sweep signal voltage rises with a constant slew rate to a predetermined ending level. Then the sweep signal returns to its starting level and remains there until the sweep is retriggered.

The horizontal position of the beam on the screen is proportional to the sweep signal voltage, and the nominal starting and ending levels of the sweep signal may be chosen so that the beam nominally starts and ends on the left and right edges of a grid superimposed on a waveform display area of the oscilloscope screen. The trigger signal initiating the sweep is typically generated when the input signal reaches a predetermined trigger level, so the trigger point on the resulting waveform display can be nominally located at the left edge of the grid. The grid divides the display area into regular vertical and horizontal divisions to enable an operator to gauge, for any point on the waveform, its magnitude and horizontal displacement from the left edge of the grid. The time delay between the trigger point and a subsequent point of interest along a waveform is typically determined by dividing the displacement (in grid divisions) of the point of interest from the left edge of the grid by the nominal "sweep rate" of the beam, a measure of the speed at which the beam travels across the screen expressed in terms of grid divisions per unit time.

However, the accuracy of such time delay determination is affected not only by the accuracy with which the operator can gauge the horizontal displacement of the point on the screen, but also by the accuracy of the sweep signal. When the actual starting level of the sweep signal does not match its nominal value, the start of the sweep does not really line up with the left edge of the grid and the sweep has an "offset error". When the actual sweep rate differs from the nominal sweep rate, the sweep signal has a "sweep rate" error. Either type of error will cause an error in a time delay determination since the determination would assume the actual sweep signal starting level and sweep rate match their nominal values.

In oscilloscopes of the prior art, the usual approach toward reducing offset and sweep rate errors has been to calibrate the sweep generator to ensure the sweep has the correct offset and sweep rate. But accurate adjustment of sweep rate and offset requires the use of laboratory test equipment and may require partial disassembly of the oscilloscope, and therefore cannot be made frequently so as to account for changes in starting level and sweep rate due to aging of oscilloscope components or changes in operating conditions.

What is needed is an easy to use method and apparatus for reducing inaccuracies in time delay determinations due to offset and sweep rate errors in the sweep signal, without requiring calibration adjustment to the sweep generator hardware.

SUMMARY OF THE INVENTION

In an oscilloscope utilizing the present invention, a sweep signal controls the horizontal position of an electron beam on a cathode ray tube screen while an input signal controls the vertical position of the beam. When the sweep signal is triggered by an event, e.g. in the input signal, the sweep signal magnitude increases from a starting level toward an ending level, desirably with a constant slew rate so as to sweep the beam across the screen at a constant horizontal speed. The beam is momentarily intensified to create a bright spot on the resulting waveform display when the sweep signal magnitude equals the output level of a digital-to-analog converter (DAC), controlled by DAC input data supplied by a microcomputer within the oscilloscope. When an operator rotates a control knob mounted on the oscilloscope front panel, the microcomputer adjusts the DAC input data so as to move the bright spot horizontally in proportion to knob rotation, thereby permitting the operator to position the bright spot anywhere on the waveform display.

According to one aspect of the invention, a microcomputer computes the delay time between the start of the sweep (which suitably corresponds to the triggering event in the input signal) and the point along the waveform display indicated by the bright spot, the computation being based on measured "sweep gain" (G) and "sweep start" (Vo) parameters characterizing the sweep signal, and on the value of the input data (D) supplied to the DAC. The sweep start parameter Vo may be expressed in terms of "DAC units" and is the value of DAC input data which would cause the DAC to produce an output voltage equal to the actual (rather than nominal) starting level of the sweep signal. The sweep gain G can be expressed in terms of DAC units per second and indicates the rate of increase in DAC input data required to produce a DAC output signal having a rate of change similar to the slew rate of the actual sweep signal. The delay time Td between the start of the sweep and the bright spot is found according to the expression:

$$Td = (D - Vo)/G.$$

When the time delay is determined in this fashion, the computation relates to the actual starting level and sweep rate of the sweep signal, and any deviation of the actual starting level or sweep rate from their nominal values has no effect on the accuracy of the time delay determination. Thus the effects of offset and sweep rate error on time delay measurement are eliminated.

According to another aspect of the invention, the sweep gain G is accurately measured utilizing a square-wave characterization signal of a known frequency to trigger the sweep on the leading edge of a first pulse of the characterization signal. The DAC input data is initially set at a value which would be required to produce a DAC output signal equal to the nominal (expected)

magnitude of the sweep signal after the sweep signal has increased for one half period of the characterization signal. A first comparator clocks a type D flip-flop when the sweep signal exceeds the DAC output signal, and a second comparator compares the characterization signal with a trigger level signal and drives its output high when the characterization signal is high, and low when the characterization signal is low. The output of the second comparator drives the D input of the flip-flop having a Q output providing an input to the microcomputer and having a reset controlled by the microcomputer. After the flip-flop is clocked during each sweep, the microcomputer adjusts the data supplied to the DAC up or down depending on whether the Q output of the flip-flop is high or low, i.e., depending on whether the calibration signal was high or low when the sweep signal reached the DAC output level. The adjustments made to the DAC input data after each sweep are progressively smaller until the adjustment amount is less than the least significant digit of the DAC input data. At that point the final adjusted value of the DAC input data represents the data value (VL) which would be required to produce a DAC output signal substantially equal to the actual sweep magnitude signal after the sweep signal has increased from its starting level for one half period of the characterization signal.

This process is repeated except that the microcomputer sets the DAC input data to a value which causes the DAC to produce an output signal equal to the nominal (expected) magnitude of the sweep signal after the sweep signal has increased for three half periods of the characterization signal. In this case, the last adjusted value of the DAC input data represents the data value (VH) which would be required to produce a DAC output signal substantially equal to the actual magnitude of the sweep signal after the sweep signal has increased from its starting level for three half periods of the characterization signal. The sweep gain G is then computed by dividing the difference between VH and VL by the period (Pc) of the characterization signal, as expressed by the equation:

G=(VH-VL)/Pc.

Since the starting point of the sweep occurred on the leading edge of the first pulse of the characterization signal, which occurred one half period before the sweep signal level corresponding to VL, the value of DAC input data Vo corresponding to the starting level of the sweep is calculated according to the expression:

Vo=VL−(G*Pc/2).

The accuracy of the measured VH and VL parameters, and therefore the accuracy of the computed G and Vo parameters, depends largely on the accuracy of the period Pc of the characterization signal.

According to a still further aspect of the invention, a high accuracy, crystal-controlled square-wave generator is mounted within the oscilloscope chassis with its output multiplexed with trigger signal inputs of the sweep generator, and the microcomputer is adapted to perform the above described characterization procedure automatically so that the values of G and Vo may be determined frequently and quickly on command of the operator, without need for additional test instrumentation. By measuring Vo and G frequently and by utilizing these parameters to compute time delays, the effects on time measurements due to changes in sweep offset or sweep rate resulting from changes in operating temperature or other causes are minimized.

It is accordingly an object of the invention to provide an improved method and apparatus for characterizing the offset and sweep rate of the output signal of a sweep generator.

It is another object of the invention to provide an improved method and apparatus for accurately determining time delays between points in a waveform displayed on an oscilloscope.

The subject matter of the present invention is particularly pointed out and distinctly claimed in the concluding portion of this specification. However, both the organization and method of operation of the invention, together with further advantages and objects thereof, will best be understood by reference to the following description taken in connection with accompanying drawings.

DRAWINGS

FIG. 1 is a block diagram of a portion of an oscilloscope utilizing the present invention;

FIG. 2 is a simplified schematic diagram of a typical sweep generator utilized in an oscilloscope;

DETAILED DESCRIPTION

Figure 3:
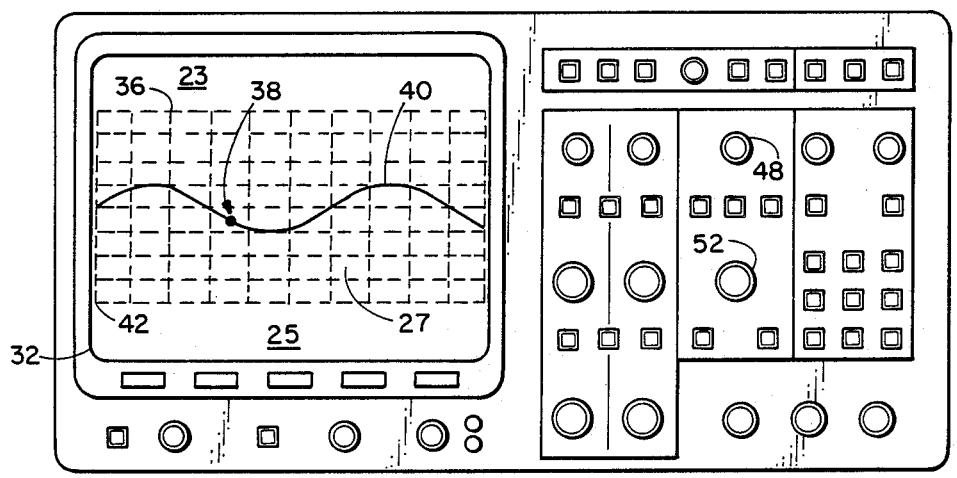
FIG. 3 is a front view of an oscilloscope utilizing the present invention.

FIG. 1 depicts in block diagram form a portion of an oscilloscope including an "A" sweep generator 10 and a "B" sweep generator 12, each adapted to produce a voltage ramp (sweep signal) output transmitted to horizontal amplifier circuits controlling the horizontal movement ("the sweep") of an electron beam across the screen of a cathode ray tube. The horizontal sweep rate of the beam is proportional to the slew rate of a selected one of the sweep signals. When the vertical position on the screen of the beam is controlled by an oscilloscope input signal generated by a device under test, a resulting waveform display on the screen represents the magnitude of the input signal as a function of time. The A and B sweep generators 10 and 12 have independently adjustable slew rates and may provide sweep control for separate traces in a multiple trace oscilloscope.

The A sweep generator 10 initially maintains its sweep signal output at a constant, predetermined starting level until the sweep is initiated by a sweep start signal from an "A gate" circuit 14 which generates the sweep start signal when the output of a trigger level comparator 16 goes high. This occurs when the magnitude of a trigger signal, transmitted to a noninverting input of comparator 16 through a multiplexer 18, exceeds the magnitude of a trigger level signal produced by a digital-to-analog converter (DAC) 20 and applied by an inverting input of the comparator 16. The trigger signal output of multiplexer 18 is selected from among various external and internal trigger sources connected to inputs of multiplexer 18, and the multiplexer selects its output from among these trigger sources according to a control signal produced by a microcomputer 22 and applied to a control input of the multiplexer 18. The output signal magnitude of DAC 20 is controlled by input data also supplied by microcomputer 22.

Once comparator 16 drives its output signal high, indicating its trigger signal input has exceeded its trigger level input, the A gate circuit 14 transmits the sweep start signal to the A sweep generator circuit 10. Thereafter, its sweep signal output voltage rises with a substantially constant slew rate set by a range control signal from microcomputer 22. The sweep signal is fed back to the A gate circuit 14 which ignores the output of comparator 16 after the sweep signal has been initiated until the sweep signal reaches a predetermined upper limit. At this point, the A gate circuit 14 terminates the sweep start signal, transmits an "end of sweep" signal to microcomputer 22, and subsequently waits until comparator 16 indicates occurrence of another trigger before reinitiating the sweep start signal. Termination of the sweep start signal (at end of sweep) causes the sweep generator 10 to reset the sweep signal to its starting level and to maintain the sweep signal at this level until the sweep is subsequently restarted by the sweep start signal.

The B sweep circuitry associated with B sweep generator 12 includes a B gate circuit 15, a comparator 17, a multiplexer 19 and a DAC 21, controlled by microcomputer 22, all of which operate in a fashion similar to gate circuit 14, comparator 16, multiplexer 18 and DAC 20 of the A sweep circuitry to produce the B sweep signal.

Although the components of the A and B sweep circuitry are well known in the art, it is helpful to briefly discuss a typical sweep generator in more detail. FIG. 2 is a simplified schematic diagram of the A sweep generator 10 including an operational amplifier 24 for producing the sweep signal as its output, a capacitor 26 coupling the output of amplifier 24 to its inverting input, a current source 28 also connected to the amplifier inverting input, an offset voltage source 29 connected to the amplifier noninverting input, and a switch 30 for selectively coupling the output of amplifier 24 to its noninverting input. When switch 30 is closed, capacitor 26 is discharged and the output of amplifier 24 is held at the offset voltage output Voff of voltage source 29. The sweep start signal from the A gate circuit 14 of FIG. 1 opens switch 30, whereupon amplifier 24 and capacitor 26 act in a well-known fashion as a Miller integrator to linearly increase the sweep signal output from the starting level Voff as capacitor 26 is charged by current from current source 28. When the sweep start signal is terminated, switch 30 closes, rapidly discharging capacitor 26 to drive the sweep signal output of amplifier 24 back to its starting level (Voff) and to maintain it there until the sweep start signal is initiated again.

The actual starting level of the sweep signal can vary from the nominal starting level voff due to inaccuracies in the output voltage of voltage source 29 and also due to inherent offset voltages in amplifier 24. The slew rate of the sweep signal is equal to the current produced by current source 28, divided by the capacitance of capacitor 26. Although only one capacitor 26 and one current source 28 are shown in the simplified schematic diagram of FIG. 2, sweep circuits for microcomputer-based oscilloscopes typically permit any one of several different capacitors and any one of several different current sources to be connected to amplifier 24 as capacitor 26 and current source 28 through microcomputer controlled switches. The various combinations of capacitance and current enables the microcomputer 22 of FIG. 1 to select any of several nominal slew rates for the sweep signal. However, any variation in the actual value of capacitor 26 or in the current produced by current source 28 from their nominal values causes the actual slew rate to differ from the nominal slew rate of the sweep signal.

FIG. 3 shows a front view of an oscilloscope including a screen 32 having a waveform display area 27 and areas 23 and 25 above and below the waveform display area for displaying data, menus and other information. A grid 36 superimposed over the waveform display area 27 divides the display area into regular vertical and horizontal "divisions" to enable an operator to gauge the magnitude and horizontal position of a point 38 on the waveform display 40. The horizontal position of the beam on the oscilloscope screen is proportional to the sweep signal voltage, and the nominal starting and ending levels of the sweep signal are suitably chosen so as to correspond to the left and right edges of the waveform display area 27, delimited by the left and right edges of grid 36. The trigger signal transmitted through multiplexer 18 of FIG. 1 may be the same as the signal under test which controls vertical beam displacement, and in such case the trigger point on the waveform display (i.e., the point on the waveform display corresponding to the point on the input signal which initiated the sweep start signal) can be nominally located at the left edge 42 of the grid 36. A time delay between the trigger point and point 38 along waveform display 40 can be approximately determined by dividing the horizontal displacement of point 38 from the left edge 42 of the grid by the nominal "sweep rate" of the beam. The "sweep rate" is proportional to the nominal slew rate of the sweep generator output signal and, being a measure of the nominal speed at which the beam travels across the screen, may be expressed in terms of grid divisions per unit time.

However, the accuracy of this manual time delay determination depends in part on the accuracy with which the sweep generator 10 controls the starting level and slew rate of the sweep signal. When the sweep generator output signal has an "offset error", wherein the actual starting level of the sweep does not correspond to the nominal (expected) starting level, the starting position of the waveform display will be offset from the left edge 42 of grid 36 such that the entire waveform display, including point 38, will be shifted to the right or to the left with respect to the grid. The sweep signal may also have a "sweep rate error" wherein the actual sweep rate of the sweep signal does not match its nominal value. Since offset and sweep rate errors are normally present, the delay time between the trigger point and point 38 calculated on the basis of the observed position of point 38 on the grid and the nominal sweep rate of the beam is subject to error.

Referring to FIG. 1, the sweep signal output of the A sweep generator 10, in addition to being supplied to the oscilloscope's horizontal preamplifier for controlling beam position, is also supplied to the inverting input of a comparator 44. The output of a "reference" DAC 46 is applied to the noninverting input of comparator 44, the DAC 46 output signal magnitude being proportional to digital data supplied to the DAC input by microcomputer 22. The output of comparator 44 provides an input to "Z-axis" circuitry of the oscilloscope controlling the intensity of the electron beam. When the sweep signal output of the A sweep generator 10 rises above the output signal level of the reference DAC 46, the output of comparator 44 goes low, causing the Z-axis circuitry to momentarily intensify the beam to create a small, bright light spot on the waveform display, as illustrated at point 38 of waveform display 40 of FIG. 3. (For illustrative purposes the spot at point 38 in FIG. 3 is shown disproportionately larger than its actual size in relation to the waveform display). The value of the input data supplied to reference DAC 46 thus controls the horizontal position of the bright spot on the screen. An operator rotates a "reference" control knob 48 mounted on the front panel of the oscilloscope to provide input through knob interface circuitry 50 to the microcomputer 22 which adjusts the data supplied to the reference DAC 46 so as to move the bright spot in proportion to knob rotation. Thus the operator may position the bright spot anywhere along the waveform utilizing knob 48.

As previously mentioned, the microcomputer 22 also sets the sweep rate of the a sweep generator 10 through a range control signal to the sweep generator which connects a selected combination of capacitor and current source to the amplifier 24 of FIG. 2. The operator may select the sweep rate for the A sweep generator utilizing a sweep range control knob 52, also mounted on the front panel of the oscilloscope, to provide a sweep rate selection signal to the microcomputer 22 through knob interface circuitry 53. Since the microcomputer 22 can determine the nominal displacement of the bright spot from the left edge of the grid based on data supplied to the reference DAC 46, and since the microcomputer knows the nominal sweep rate from the sweep range setting, it could be programmed to divide the nominal displacement by the nominal sweep rate in order to determine the approximate time delay between the trigger event which caused initiation of the sweep and the point of interest in the input waveform corresponding to the highlighted point 38 of the waveform display. However, such a microcomputer calculated delay time would also be subject to error insofar as the sweep signal is subject to offset and sweep rate errors.

According to the present invention, microcomputer 22 is adapted to compute the delay time between the actual trigger point on the input signal and the point along the input waveform corresponding to the point 38 indicated by the bright spot based on measured "sweep start" (Vo) and "sweep gain" (G) parameters characterizing the sweep signal, and on the value (D) of the data supplied as input to the reference DAC 46 to set the current position of the bright spot. The sweep start parameter Vo is expressed in terms of "DAC units" and is the value of DAC 46 input data which would cause DAC 46 to produce an output voltage equal to the actual (rather than nominal) starting level of the sweep signal. The sweep gain G is expressed in terms of "DAC units per second" and indicates the rate of increase in DAC 46 input data required to produce a DAC output signal which increases at a rate similar to the slew rate of the sweep signal. The delay time Td between the bright spot and the start of the sweep is determined according to the expression:

$$Td = (D - Vo)/G.$$

This computed time delay may then be provided to the operator, for example, in the form of a display on the oscilloscope screen. Thus according to the present invention, the sweep signal is characterized by a starting DAC input data value (Vo) and a rate of change of DAC input data value (G) which would cause the DAC to produce an output signal having a similar starting level and slew rate as the actual starting level and slew rate of the sweep signal. The Vo, G, and D parameters (rather than the nominal starting position and sweep rate of the sweep and the position of the bright spot with respect to the grid) are then utilized to compute Td. When the time delay is computed in this fashion, the computation is based on the actual starting level and slew rate of the sweep signal and any deviation of the actual starting position or sweep rate of the sweep from their nominal values has no effect on the accuracy of the time delay determination. Thus the effects of offset and sweep rate error on time delay measurement are eliminated.

The values of Vo and G are determined utilizing a type D flip-flop 54 and a programmable clock 56, included in the oscilloscope circuitry as shown in FIG. 1. The output of comparator 44 drives the clock input of flip-flop 54, the microcomputer 22 controls the reset (R) input, and the output of the B sweep circuit comparator 17 controls the D input. The Q output of flip-flop 54 is transmitted to the microcomputer 22. The microcomputer 22 controls the period of a square-wave "characterization" signal produced by clock 56, and the characterization signal is provided as an additional trigger source input to both multiplexers 18 and 19.

The microcomputer 22 initiates measurement of the sweep gain and sweep start parameters G and Vo by setting multiplexers 18 and 19 to connect the characterization signal output of clock 56 to the noninverting inputs of comparators 16 and 17, and by setting the trigger level outputs of DACs 20 and 21 such that the square-wave signal produced by clock 56 drives the outputs of comparators 16 and 17 high on the leading edges of its pulses, and low on the trailing edges. The microcomputer 22 also sets the input data to DAC 46 to a value which would cause the DAC 46 to produce an output signal of magnitude near the nominal value to which the sweep signal would rise one half period of the characterization signal following sweep triggering on the leading edges of characterization signal pulses.

Figure 4:
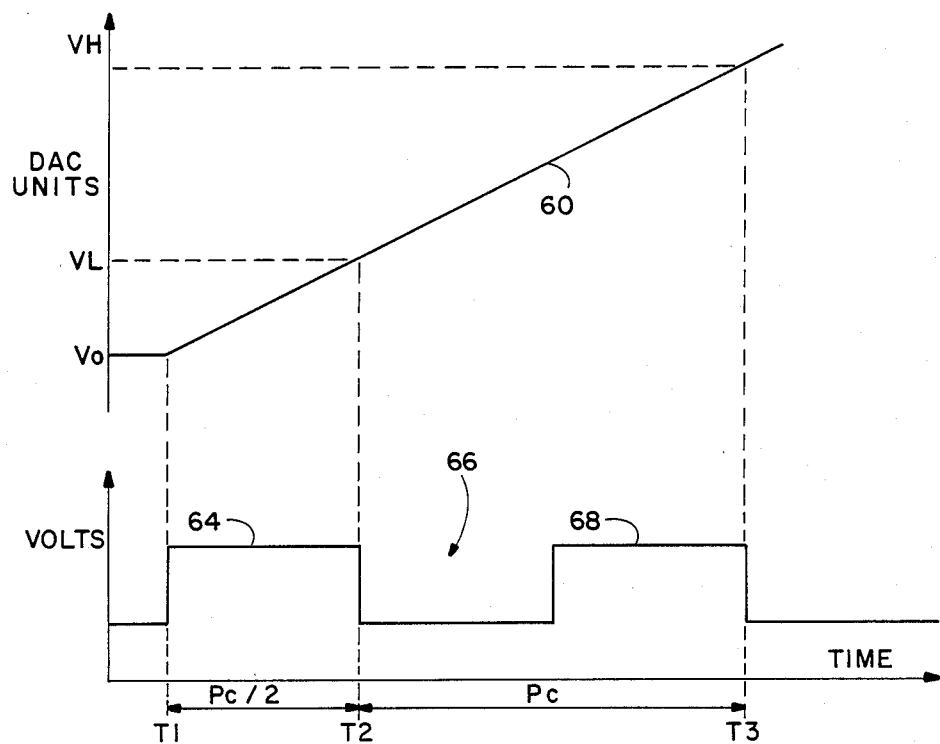
FIG. 4 is a graph showing the time dependent behavior of a sweep signal in relation to a square-wave characterization signal.

FIG. 4 includes a graph of the A sweep signal 60 and a graph of the magnitude of the characterization signal 66 as functions of time. The magnitude of the characterization signal 66 is expressed as a voltage. However, the magnitude of the sweep signal is expressed not in voltage, but in equivalent "DAC units". Since the output voltage of DAC 46 is proportional to the magnitude of its input data, it is convenient to express a particular DAC 46 or A sweep generator 10 output voltage in terms of the magnitude of DAC 46 input data ("DAC units") which would cause the DAC 46 to produce the particular voltage. Referring to FIGS. 1 and 4, when the sweep signal 60 is triggered at time T1 by the leading edge of the first pulse 64 of the characterization signal 66, the sweep signal magnitude begins to increase, and when the sweep signal rises to the magnitude of the output of DAC 46, the falling edge of the comparator 44 output clocks flip-flop 54. In the meantime, comparator 17 of the B sweep circuitry compares the characterization signal output of clock 56 with the trigger level signal output of DAC 21, driving its output high when the characterization signal is high and low when the characterization signal is low. When the output of comparator 17 is high at the time the flip-flop 54 is clocked on the trailing edge of the output of comparator 44, flip-flop 54 is set. If the output of comparator 17 is low when flip-flop 54 is set, flip-flop 54 is reset. After the end of each sweep, as indicated by the end of sweep signal provided by the A gate circuit 14, the microcomputer 22 reads the state of flip-flop 54 and then resets it.

After the flip-flop 54 is clocked by the output of comparator 44 following initiation of each sweep, the microcomputer 22 adjusts the input data supplied to DAC 46 up or down depending on whether the Q output of the flip-flop is high or low, i.e., depending on whether or not the trailing edge of the first characterization signal pulse 64 (occurring at time T2) had occurred by the time the sweep signal reached the DAC 46 output level. The microcomputer continues to adjust the DAC 46 input data following each sweep by progressively smaller amounts until the resolution limit of DAC 46 is reached. At that point the final adjusted value of the DAC 46 input data represents the data value (VL) which would be required to produce a DAC 46 output signal equal to the actual magnitude of the sweep signal at time T2 in FIG. 4, when the sweep signal has increased from its starting level for one half period of the characterization signal 66.

The microcomputer 22 then sets the input data to DAC 46 to a value would cause the DAC to produce an output level near the nominal sweep signal level which would occur on the trailing edge of the second characterization signal pulse 68 at time T3 following sweep triggering, and repeats the iterative DAC input data adjustment process. This time the clocking of flip-flop 54 occurs progressively nearer to time T3 as the DAC 46 input data is adjusted by ever smaller amounts. At the end of the second iterative adjustment process, the value of the DAC input data represents the data value (VH) which would be required to produce a DAC 46 output signal substantially equal to the actual magnitude of the sweep signal after the sweep signal has increased from its starting level for three half periods of the characterization signal.

The microprocessor 22 then computes the sweep gain G (in DAC input data units per second) by dividing the difference between VH and VL by the period (Pc) of the characterization signal, as expressed by the equation:

$$G = (VH - VL)/Pc.$$

Since the starting point of the sweep occurred on the leading edge of the first pulse 64 of the characterization signal 66, which occurred one half period (Pc/2) of the characterization signal before the sweep signal level corresponding to VL, the microcomputer 22 calculates the value of DAC 46 input data Vo corresponding to the starting level of the sweep according to the expression:

$$Vo = VL - (G*Pc/2)$$

or equivalently, $$Vo = VL - (VH-VL)/2.$$

The accuracy of the measured VH and VL parameters, and therefore the accuracy of the computed G and Vo parameters, depends on the accuracy of the period Pc of the characterization signal. Therefore clock 56 suitably comprises a crystal-controlled or other type of highly accurate, highly stable oscillator. By mounting clock 56 and flip-flop 54 within the oscilloscope chassis, and by programming microcomputer 22 to automatically perform the VH and VL measurements and to adjust the values of the computed G and Vo parameters, the G and Vo parameters may be adjusted easily and frequently such that the effects on time delay measurements of changes in sweep signal offset and sweep rate resulting from changes in operating temperature or other causes are eliminated.

Although additional circuitry for controlling a bright spot position on a trace driven by the B sweep generator 12, and for measuring VL and VH parameters associated with the B sweep generator, is not shown in FIG. 1, it is understood that such circuitry is easily provided and that Vo and G parameters characterizing the sweep signal output of the B sweep generator may be computed following a procedure similar to that discussed in conjunction with the A sweep generator 10.

It should also be understood that the values of G and Vo differ for each combination of capacitor and current source utilized in the sweep generator 10. Accordingly measurement of VH and VL and computation of G and Vo may be performed for each different combination of capacitor and current source, and the resulting G and Vo parameters may be stored for subsequent use in computing time delays. During the measurement process, the period Pc of the characterization signal must be adjusted for each combination of capacitor and current source to be small enough that the time required for the sweep to increase from its starting level to its ending level is longer than at least one and one half cycles of the characterization signal. Thus, for example, if a sweep requires 10 mS, the characterization signal should not be greater than 6.66 mS, or two thirds of the sweep time. On the other hand, measurements are more accurate when VL and VH differ as much as possible. Thus the period Pc of the calibration signal is suitably smaller than, but as close as possible to, two thirds of the maximum expected sweep time for each given combination of capacitor and current source.

With reference to FIG. 4, the range of DAC input data within which the microcomputer searches for VH should be broad enough that the trailing edge of the second characterization signal pulse 68 always occurs when the sweep signal is within the DAC output voltage range produced in response to the selected range of DAC input data. However, the DAC input data search range should also be narrow enough that the leading edges of the second and third characterization pulses never occur when the sweep signal is within the corresponding range of DAC output voltages. Accordingly, the DAC input data can be restricted to a range extending from VH(min) to VH(max), the minimum and maximum expected values of VH wherein $$VH(min) = Vo(min) \degree G(min)(3Pc/2)$$

and $$VH(max) = Vo(max) \degree G(max)(3Pc/2).$$

In the above expressions Vo(min) and Vo(max) are the minimum and maximum expected values for the sweep start parameter Vo, and G(min) and G(max) are the minimum and maximum expected values for the sweep gain parameter G. These expected values may be estimated based on the tolerances associated with the sweep generator 10 and DAC 46. Letting VH0 equal the center of the range, the search range for VH is:

$$VH0 \degree / - [VH(max) - VH(min)]/2.$$

Letting $RV=[VH(max)-VH(min)]/2$, the search range for VH may also be expressed as $VH0°/-RV$. The DAC 46 input data search range for VL may be restricted to a similar range $(°/-RV)$ about its nominal expected value VL0.

In the preferred embodiment of the invention, the sweep generator 10 permits selection from among three different capacitors (e.g. capacitors 1-3) and nine different current sources (e.g., sources 1-9) in order to establish a desired sweep rate. Since 27 different combinations of capacitor and current sources are possible, it would take a noticeably long time for the oscilloscope to measure VH and VL and to compute Vo and G for each combination. However, the number of measurements required may be reduced in view of the fact that a change in the value of the capacitor 26 of the sweep generator circuit of FIG. 2 affects only the slew rate of the sweep signal output and not its starting level, such change in slew rate being inversely proportional to the change in capacitance. Thus in the preferred embodiment of the invention, the VH and VL are initially measured nine times, once for each current source 1-9 suitably in combination with capacitor 2. The Vo and G parameters corresponding to each of the nine VH and VL measurements are computed in the manner described hereinabove and the results stored in a random access memory within microcomputer 22. Then the VH and VL parameters are measured two additional times, once for each combination of current source 5 and the other two capacitors 1 and 3, and the associated G parameters are computed. Finally a "gain correction factor" Gc(X) is computed for each capacitor according to the following expression (where X is the capacitor number 1-3):

$$Gc(X)=G(X,5)/G(2,5)$$

In the above expression, G(X,5) is the computed sweep gain parameter for the combination of capacitor X and current source 5, and G(2,5) is the computed sweep gain parameter for the combination of capacitor 2 and current source 5. Gc(X) is a unitless quantity and represents the fractional increase in sweep gain that would be caused by substituting capacitor X for capacitor 2 when used in conjunction with current source 5. It should be noted that the fractional increase in sweep gain occasioned by a change in capacitance would be the same regardless of what current source is used in the sweep generator. It is also noted that Gc(2) is unity. Thus the sweep gain G(X,Y) for any combination of capacitor X and current source Y is equal to the product of G(2,Y) and Gc(X). Once Gc(X) is computed for each capacitor X and stored in memory, subsequent calculations for time delays Td when the sweep rate is determined by a combination of a capacitor X and a current source Y are performed according to the following expression:

$$Td=[D-Vo(2,Y)]/[G(2,Y)Gc(X)]$$

where D is the DAC 46 input data value and where Vo(2,Y) and G(2,Y) are the measured Vo and G parameters for capacitor 2 and current source Y.

In some applications it is preferable to have microcomputer 22 compute the displacement of the bright spot from the start of the sweep in units of "grid divisions" rather than the delay time that the displacement represents. In such case the computed sweep gain G(X,Y) for the combination of capacitor X and current source Y may be normalized by multiplying it by the nominal sweep range R(X,Y), expressed in horizontal grid divisions per second, to create a normalized sweep gain parameter Gs(X,Y) expressed in "DAC units/division". This parameter may then be utilized to relate the magnitude of the input data D to DAC 46 to the displacement of the bright spot from the start of the sweep (in grid divisions) according to the expression:

$$displacement=[D-Vo(2,Y)]/[Gs(2,Y)Gc].$$

Figure 5:
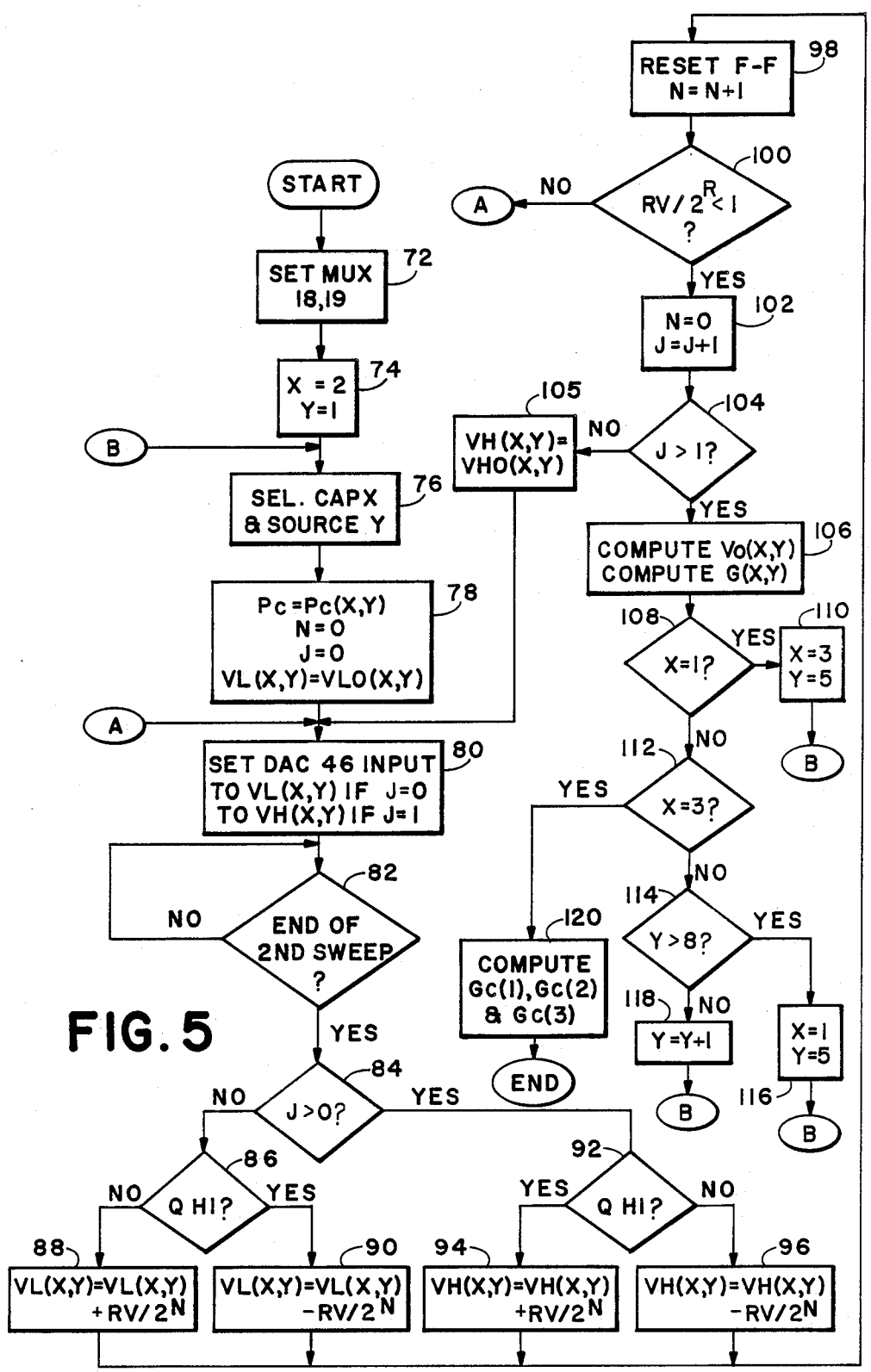
FIG. 5 is a flow chart of a program for the microcomputer of FIG. 1 for carrying out a sweep error measurement process according to the present invention.

FIG. 5 is a flow chart of a program for microcomputer 22 of FIG. 1 for measuring VH and VL, for computing Vo(X,Y) and G(X,Y) for each combination of capacitor 2, and current source 1-9 and for the combinations of capacitors 1 and 3 and current source 5, and for computing Gc(X) for capacitors 1-3. Starting at block 72, the microcomputer sets multiplexers 18 and 19 of FIG. 1 to select the characterization signal as the trigger input to comparators 16 and 17 and then (block 76) the microcomputer sets capacitor index X to indicate capacitor 2, and current source index Y to indicate current source 1. The microprocessor (in block 76) next sets the range signal to sweep generator 10 to connect capacitor X and current source Y to the amplifier 24 of FIG. 2. In block 78, the period Pc of the characterization signal is set to the appropriate value Pc(X,Y), the VL(X,Y) parameter is set to its nominal value VL0(X,Y) for the combination of capacitor X and current source Y, and a pair of indexes N and J are set to 0. The J index is 0 when the microprocessor is currently searching for VL and 1 if it is currently searching for VH. The N index is utilized to determine the amount by which the DAC 46 input data is to be increased or decreased after each sweep cycle. Since J is initially 0, the DAC 46 input data is set (block 80) to the current value of VL(X,Y).

Since the DAC input data may have been changed in block 80 during a sweep, the microprocessor waits (block 82) until the A gate circuit 14 of FIG. 2 indicates that the sweep has ended twice, thereby ensuring that the DAC 46 input data remained unchanged for a full sweep. Thereafter, (block 84), the microprocessor checks whether the J index is greater than 0, and if not, it checks to see if the Q output of flip-flop 54 of FIG. 2 is high (block 86). If Q is high, VL(X,Y) is incremented by $RV/2^N$ (block 88) and if Q is low, VL(X,Y) is decremented by $RV/2^N$ (block 90), where RV is the search range described hereinabove. Thereafter (block 98) flip-flop 54 is reset and the value of N is incremented. If $RV/2^N$ is not less than 1 (block 100), i.e., if the amount by which VL(X,Y) was last changed is not less than one DAC 46 input unit, then program flow is directed back to block 80 wherein the microcomputer sets the DAC 46 input data to the new value of VL(X,Y).

The process continues to iterate through the loop formed by blocks 80, 82, 84, 86, 88 (or 90), 98 and 100, until the value of VL(X,Y) has been adjusted in block 88 and/or 90 with the resolution of the DAC 46, at which point $RV/2^N$ is less than 1 (block 100). Thereafter (block 102), the value of N is set to $\phi$, and the value of J is incremented. If J is not greater than 1 (block 104), then the value of VH(X,Y) is set to the nominal, expected, value VHO(X,Y) of the DAC 46 input data for the present combination of capacitor X and current source Y (block 105). The microcomputer thereupon returns to block 80 and resets the DAC input data to the initial value of VH(X,Y) and then waits for two end of sweep signals (block 82). Since J is now greater than φ (block 84), the microcomputer checks the value of the Q output of flip-flop 54 (block 92) and increments VH(X,Y) by $RV/2^N$ if Q is high (block 94), or decrements VH(X,Y) by $RV/2^N$ if Q is low block 96). Flip-flop 54 is reset and N is incremented in block 98 and, if $RV/2^N$ is not less than 1 (block 100), the microcomputer returns to block 80. The microcomputer continues to iterate through the loop formed by blocks 80, 82, 84, 92, 94 (or 96), 98 and 100, until the value of VH(X,) has been adjusted in block 94 and/or 96 within the resolution limit of the DAC 46, at which point $RV/2^N$ is less than 1 (block 100). Thereafter (block 102) the value of N is reset to φ and the value of J is incremented to 2. Since J is now greater than 1 (block 104), the microcomputer computes (block 106) the values of Vo(X,Y) and G(X,Y) for the combination of capacitor 2 and current source 1 from the last adjusted values of VL(X,Y) and VH(X,Y) according to the relations described hereinabove.

If the value of X is not 1 (block 108) and is not 3 (block 112), and if Y is not greater than 8 (block 114), then Y is incremented by 1 (block 118) and the program returns to block 76 where the range signal to the A sweep generator is set such that capacitor 2 and current source 2 are selected since X and Y each have the value 2. In block 78 the period Pc of the characterization signal is altered and the VL(X,Y) parameter is set to a new initial value to suit the new combination of capacitor X and current source Y, and the N and J indexes are reinitialized. The iterative process indicated by blocks 80–106 is repeated such that Vo(X,Y) and G(X,Y) are computed for this combination of capacitance and current source. Thereafter, in block 118, Y is incremented again and program flow returns to block 76. Eventually, after Y has been incremented to 9, Vo(X,Y) and G(X,Y) will have been computed for each combination of capacitor 2 and current sources 1–9 at which point (block 114) Y exceeds 8 and therefore (block 116) X is set to 1 and Y is set to 5. Program operation again returns to block 76 where capacitor 1 and current source 5 are selected. The iterative VL(X,Y) and VH(X,Y) measurement process is repeated and Vo(X,Y) and G(X,Y) are computed for the combination of capacitor 1 and current source 5 (block 106). Since X is 1, block 108 directs the program through block 110 where X is set to 3 and Y is set to 5, and then back to block 76 where capacitor 3 and current source 5 are selected. The iterative measurement process is repeated once more, with the values of Vo(X,Y) and G(X,Y) being computed (block 106) for capacitor 3 and current source 5. Since X is now 3, block 112 leads to block 120 where the values of Gc(1), Gc(2), and Gc(3) are computed according to the previously described relationships based on the measured values of Vo(X,Y) and G(X,Y) computed in block 106. The measurement process thereupon ends.

Thus, according to the present invention, an oscilloscope computes the delay time between the start of a sweep signal and a selected point along a displayed waveform based on measured sweep gain (G) and sweep start (Vo) parameters characterizing the sweep signal, and on the value of data (D) supplied a DAC which produces an output voltage controlling point selection. The sweep start parameter Vo is the value of data applied to the DAC which would cause the DAC to produce an output voltage equal to the actual starting level of the sweep signal, and the sweep gain parameter G indicates the rate of increase in DAC input data required to produce a DAC output signal with the same slew rate as the sweep signal. The sweep gain G and sweep start Vo parameters are accurately determined by utilizing a square-wave signal of a known period to trigger the sweep, iteratively adjusting DAC input data, and comparing the sweep signal to the resulting DAC output signal to determine two values VL and VH of DAC input data which produce DAC output voltages matching the sweep signal magnitude at two different pulse edges of the square wave signal. Parameters G and Vo are then computed from VL and VH and the known period of the square-wave signal.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method utilizing a variable signal source producing an output signal proportional to an input value for characterizing a sweep signal which has a magnitude changing with a substantially constant slew rate from a starting level, the method comprising the steps of:

determining a sweep gain parameter indicating a rate of change of input value which would cause said variable signal source to produce an output signal having a rate of change similar to the slew rate of said sweep signal; and determining a sweep start parameter indicating an input value which would cause said variable signal source to produce an output signal substantially equal to said sweep signal starting level.

2. A method, utilizing digital-to-analog conversion means, for characterizing a triggered sweep signal which has a magnitude changing with a substantially constant slew rate from a starting level, the method comprising the steps of:

determining two values of input data which cause said digital-to-analog conversion means to produce an output signal substantially equal in magnitude to said sweep signal at two different times separated by a known period; and determining a sweep gain parameter according to said two values of input data and said known period, said sweep gain parameter indicating a rate of change of input data which would cause said digital-to-analog conversion means to produce an output signal having a rate of change similar to the slew rate of said sweep signal.

3. The method according to claim 2 further comprising the step of determining a sweep start parameter according to said two values of input data and said known period, said sweep start parameter indicating a value of input data which would cause said digital-to-analog conversion means to produce an output signal substantially equal to said sweep signal starting level.

4. The method according to claim 2 wherein the step of determining said two values of input data comprises the substeps of:

generating a periodic signal;

triggering said sweep signal on multiple occurrences of a first triggering event in said periodic signal;

varying input data to said digital-to-analog conversion means; and comparing the output signal of said digital-to-analog conversion means to said sweep signal to determine two values of input data which cause said digital-to-analog conversion means to produce an output signal substantially equal in magnitude to said sweep signal on occurrence of second and third triggering events in said periodic signal, said second and third triggering events following each of said multiple occurrences of said first triggering event by known periods.

5. The method according to claim 4 wherein said periodic signal comprises a square wave signal and said first, second, and third triggering events comprise occurrences of pulse edges of said square wave signal.

6. A method utilizing a variable signal source producing an output signal proportional to an input value for determining a delay time required for an electron beam to move between two points along a trace produced on a cathode ray tube screen as the electron beam strikes the screen, the position of the electron beam along one axis of the screen being controlled according a triggered sweep signal which changes in magnitude with a substantially constant slew rate from a starting level, the method comprising the steps of:

characterizing the sweep signal according to a sweep gain parameter and a sweep start parameter, said sweep gain parameter indicating a rate of change of input value which would cause said variable signal source to produce an output signal having a rate of change similar to the slew rate of said sweep signal, and said sweep start parameter indicating an input value which would cause said variable signal source to produce an output signal substantially equal to said sweep signal starting level;

selecting the position along said trace of one of said two points according to the magnitude of the output signal of said variable signal source produced in response to a particular input value to said variable signal source; and determining said time delay according to said sweep gain parameter, said sweep start parameter, and said particular input value.

7. The method according to claim further comprising the step of increasing an intensity of said electron beam when the magnitude of said sweep signal reaches the magnitude of said variable signal source output signal produced in response to said particular input value.

8. The method according to claim 6 wherein the step of characterizing the sweep signal comprises the substeps of:

determining two input values which cause said variable signal source to produce an output signal substantially equal in magnitude to said sweep signal at two different times separated by a known period; and determining said sweep gain parameter and sweep start parameter according to said two input values and said known period.

9. The method according to claim 8 wherein the step of determining said two input values comprises the substeps of:

generating a periodic signal;

triggering said sweep signal on multiple occurrences of a first triggering event in said periodic signal;

varying the input value to said variable signal source; and comparing the output signal of said variable signal source to said sweep signal to determine two input values which causes said variable signal source to produce an output signal substantially equal in magnitude to said sweep signal on occurrence of second and third triggering events in said periodic signal following each of said multiple occurrences of said first triggering event by known periods.

10. The method according to claim 9 wherein said periodic signal comprises a square wave signal and said first, second, and third triggering events comprise occurrences of pulse edges of said square wave signal.

11. An apparatus for characterizing a sweep signal which changes with a substantially constant slew rate from a starting level, comprising:

means for producing an output signal in response to input data; and means for determining a sweep gain parameter indicating a range of change of input data which would cause said means for producing an output signal to produce an output signal having a rate of change similar to the slew rate of said sweep signal and for determining a sweep start parameter indicating a value of input data which would cause said means for producing an output signal to produce an output signal substantially equal to said sweep signal starting level.

12. The apparatus according to claim 11 wherein said means for producing an output signal comprises digital-to-analog conversion means.

13. An apparatus for characterizing a triggered sweep signal which has a magnitude changing with a substantially constant slew rate from a starting level, comprising:

means for producing an output signal in response to input data; and means for determining two values of input data which cause said means for producing an output signal to produce an output signal substantially equal in magnitude to said sweep signal at two different times separated by a known period and for determining a sweep gain parameter and a sweep start parameter according to said two values of input data and said known period, said sweep gain parameter indicating a rate of change similar to the slew rate of said sweep signal, said sweep start parameter indicating the value of input data which would cause said means for producing an output signal to produce an output signal substantially equal to said sweep signal starting level.

14. The apparatus according to claim 13 wherein said means for producing an output signal comprises digital-to-analog conversion means.

15. An apparatus according to claim 13 wherein said means for determining said two values of input data comprises:

means for generating a periodic signal;

means for triggering said sweep signal on multiple occurrences of a first triggering event in said periodic signal;

means for comparing the output signal of said means for producing an output signal to said sweep signal and for producing a comparison signal indicating whether said output signal exceeds said sweep signal; and means for monitoring said comparison signal and for varying said input data to determine two values of input data which cause said means for producing an output signal to produce an output signal substantially equal in magnitude to said sweep signal on occurrence of second and third triggering events in said periodic signal, said second and third triggering events following each of said multiple occurrences of said first triggering event by known periods.

16. An apparatus according to claim 15 wherein said periodic signal comprises a square wave signal and said first, second, and third triggering events comprise occurrences of pulse edges of said square wave signal.

17. The apparatus according to claim 15 wherein said means for generating said periodic signal comprises a crystal-controlled oscillator.

18. An apparatus for determining a delay time required for an electron beam to move between two points along a trace produced on a cathode ray tube screen as the electron beam strikes the screen, a position of the electron beam along one axis of the screen being controlled according to a triggered sweep signal which changes in magnitude with a substantially constant slew rate from a starting level, the apparatus comprising:
- a variable signal source for producing an output signal proportional to an input value;
- means for selecting the position along said trace of one of said two points according to the magnitude of the output signal of said variable signal source produced in response to a particular input value; and
- means for characterizing the sweep signal according to a sweep gain parameter and a sweep start parameter, said sweep gain parameter indicating a rate of change of input value which would cause said variable signal source to produce an output signal having a rate of change similar to the slew rate of said sweep signal, and said sweep start parameter indicating an input value which would cause said variable signal source to produce an output signal substantially equal to said sweep signal starting level, and for determining said time delay according to said sweep gain parameter, said sweep start parameter, and said particular input value.

19. An apparatus according to claim 18 wherein said means for selecting comprises means for increasing the intensity of said electron beam when said sweep signal reaches the magnitude of said variable signal source output signal produced in response to said particular input value.

20. The apparatus according to claim 18 wherein said variable signal source comprises digital-to-analog conversion means.

21. An apparatus according to claim 18 wherein said means for characterizing the sweep signal comprises means for determining two input value which cause said variable signal source to produce an output signal substantially equal in magnitude to said sweep signal at two different times separated by a known period, and for determining said sweep gain parameter and sweep start parameter according to said two input values and said known period.

22. An apparatus according to claim 21 wherein said means for determining two input values comprises:
- means for generating a periodic signal;
- means for triggering said sweep signal on multiple occurrences of a first triggering event in said periodic signal;
- means for comparing the output signal of said variable signal source to said sweep signal and for producing a comparison signal indicating when said output signal exceeds said sweep signal; and
- means responsive to said comparison signal for varying the input value to said variable signal source to determine two input values which cause said variable signal source to produce an output signal substantially equal in magnitude to said sweep signal on occurrence of second and third triggering events in said periodic signal, said second and third triggering events following each of said multiple occurrences of said first triggering event by known periods.

23. An apparatus according to claim 22 wherein said means for generating said periodic signal comprises a crystal-controlled oscillator, said periodic signal comprising a square wave signal, said first, second, and third events comprising occurrences of edges of said square wave signal.

* * * * *